United States Patent [19]
Eckenbrecht
[11] 3,906,368
[45] Sept. 16, 1975

[54] AUTOMATIC ALIGNMENT METHOD AND APPARATUS FOR TUNER MECHANISM

[75] Inventor: Robert Roy Eckenbrecht, East Bethany, N.Y.
[73] Assignee: GTE Sylvania Incorporated, Stamford, Conn.

[22] Filed: Dec. 7, 1973
[21] Appl. No.: 422,928

[52] U.S. Cl. .................... 325/452; 333/17
[51] Int. Cl.² .................... H04B 1/06; H03G 11/04
[58] Field of Search ...... 325/363, 470, 471; 334/26, 334/27, 28; 333/17, 18

[56] References Cited

UNITED STATES PATENTS 2,843,747 7/1958 Ashley .................... 333/17

*Primary Examiner*—Robert L. Griffin
*Assistant Examiner*—Robert Hearn
*Attorney, Agent, or Firm*—Norman J. O'Malley; Robert E. Walrath; Thomas H. Buffton

[57] ABSTRACT

Method and apparatus for automatically presetting the individual channels of a multi-channeled tuning mechanism having separate controls for each individual channel includes a motordriven tuning arm adapted to sequentially engage each of the separate controls for the individual channels of the tuning mechanism. As each channel control is engaged by the tuning arm, a signal corresponding to the frequency of the selected channel is applied to the input of the tuning mechanism and the output therefrom is monitored. The tuning arm in engagement with the channel control is then activated, turning the control until the monitored output derived from the tuning mechanism indicates that the channel is properly tuned. After each channel has been tuned, the motor-driven tuning arm is stopped, disengaged from that channel control and stepped to a position for engagement with the subsequent control for the succeeding channel to be tuned. The process is repeated until all channels are properly tuned.

4 Claims, 6 Drawing Figures

AUTOMATIC ALIGNMENT METHOD AND APPARATUS FOR TUNER MECHANISM

BACKGROUND OF THE INVENTION

This invention relates generally to multi-channel tuning mechanisms and more particularly to improved methods and apparatus for automatically presetting to predetermined frequencies each of the channels of a multi-channel tuning mechanism.

In many areas of radio communication there have been increasing utilization or requirements for preset tuned channels to permit the ready and easy selection of a desired channel of communication. This has been particularly true with respect to television receivers, wherein present requirements are moving toward the need for a 20 or more channel preselected tuning mechanism, enabling the viewer to readily choose any one of the preselected channels. In a typical situation the 20 preset channels may include the 12 VHF channels and eight randomly selected UHF channels in a given area of interest. In the manufacture of television sets with such tuning mechanisms, it thus becomes necessary at the factory to preset each of the individual channels of the tuning mechanism to provide the proper output to the IF of the television receiver. It is desirable to have an accurate, efficient and economical way of accomplishing such preset fine tuning. Typically in the past the setting of such tuning mechanisms has been accomplished utilizing a human operator to tune each channel against a meter or other similar indicating device. This is a slow process, and sometimes is not very accurate in establishing the tuning of a given channel since, for example, it is often accomplished by presetting to an output voltage rather than a frequency, between which there might be some discrepancy.

The time factor alone can be relatively expensive since an individual operator at a given station would take a significant amount of time to run through all twenty channels and pretune each one properly. Also, in addition to the time factor, there is the element of potential operator error involved in the tuning operation, such as, for example, tuning two channels to the same frequency, skipping a channel or merely just having one or more channels out of a reasonable tuning range with the existing frequency thereof.

OBJECTS AND SUMMARY OF THE INVENTION

Accordingly, it is a principal object of this invention to provide improved tuning method and apparatus for tuning a multi-channel tuning mechanism which overcomes the foregoing disadvantages of the prior art.

A further object of the invention is to provide a multi-channel tuning capability which minimizes the possibility of human error.

A more specific object of the invention is to provide a multi-channel tuning capability which tunes a plurality of channels in a minimum amount of time with all channels being tuned to within a given minimal deviation from the channel center frequency.

Yet another object of the invention is to provide a multi-channel tuning capability which will automatically indicate an error in a tuning device which precludes the possibility of accurately tuning that mechanism.

The foregoing and other objects and advantages of the invention are accomplished according to one embodiment in which the individual channels of a multi-channel tuning device having separate controls for each individual channel is positioned to be adapted for engagement with a motor-driven tuning arm which is further operative to sequentially engage each of the individual controls of the tuning mechanism. Operating in conjunction with the motor driven tuning arm is a source of channel frequencies corresponding to the desired frequencies to which each of the individual channels of the tuning mechanism is to be tuned. The tuning apparatus including the motor-driven tuning arm and source of frequency controls is placed into engagement with the first control arm of the tuning mechanism and the first input frequency from the frequency source is applied to the input of the tuning mechanism and the output thereof is monitored. At the same time the motor-driven tuning arm is activated to turn the control device through its tuning capability until the output from the apparatus indicates that the channel is set to the proper frequency. The motor-driven tuning arm is then disengaged from that channel control and automatically stepped to the next channel of the tuning mechanism and simultaneously the second source of channel frequency is applied to the input of the tuning mechanism and the sequence is repeated to properly align the second channel of the tuning mechanism. This sequence is repeated until all channels are properly tuned. The tuning apparatus also includes means for detecting the situation where the apparatus is unable to properly tune a given channel. The apparatus in such a situation produces an indicator signal, such as a flashing light or a buzzer, to notify a monitoring operator that a difficulty has been encountered in tuning that particular channel.

DESCRIPTION OF THE PREFERRED EMBODIMENT

For a better understanding of the present invention, together with other and further objects and advantages thereof, reference is made to the following detailed description taken in conjunction with the above-described drawings.

Figure 1:
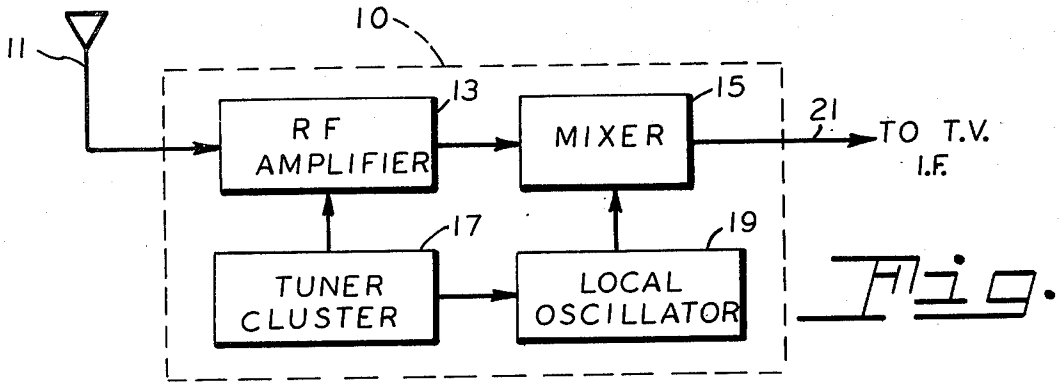
FIG. 1 is a block diagram of a tuner adapted for use in a television receiver according to the present invention.

Referring first to FIG. 1 there is shown in block diagram form a representation of a typical television tuner 10 which includes an antenna 11, the input of which is applied to an RF amplifier 13, the output of which is applied to a mixer 15. A tuner cluster 17 generates an output to a local oscillator 19 which in turn also provides an input to the mixer 15. The output 21 from the mixer is applied to the intermediate frequency channel amplifier of a television receiver in well known fashion.

In operation as is generally known, all the signals from the antenna are applied to the RF amplifier wherein they are amplified and supplied to the mixer stage. The tuner cluster 17 provides an output which is uniquely dependent upon the particular channel selected which varies the frequency output of the local oscillator to the mixer and thereby meets with the RF amplified signal of the selected channel to provide a unique output at the intermediate frequency to be applied to the remainder of the television system. The local oscillator of the tuner may be voltage-dependent, capacitive-dependent or dependent upon any other of a number of control parameters to select the proper local oscillator frequency necessary to derive the selected station.

Figure 2:
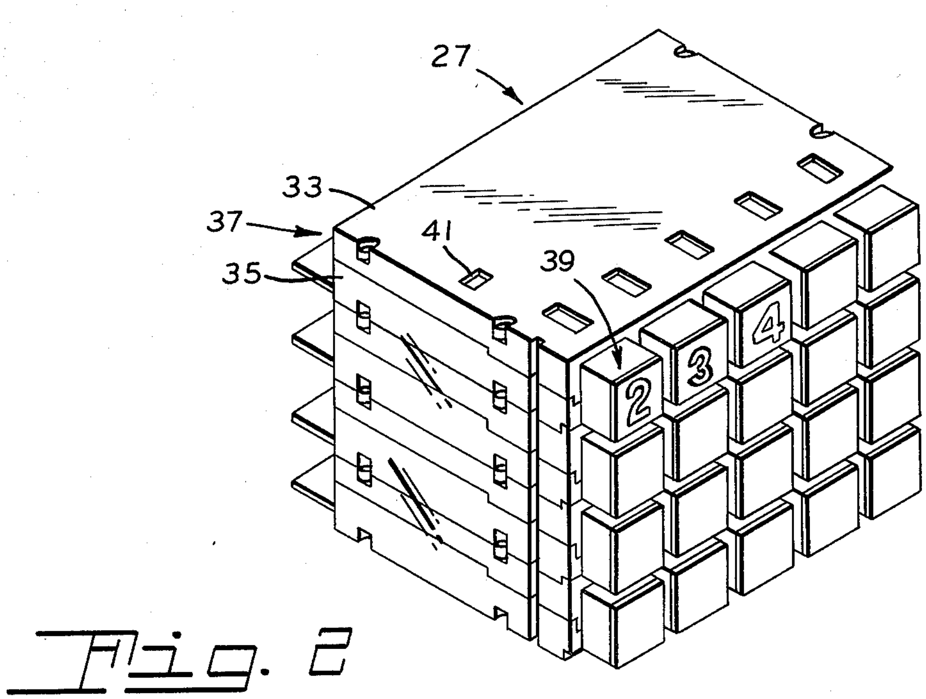
FIG. 2 is an isometric view of a push button tuner module having a plurality of push buttons suitable for use in a television receiver according to the present invention.
Figure 3:
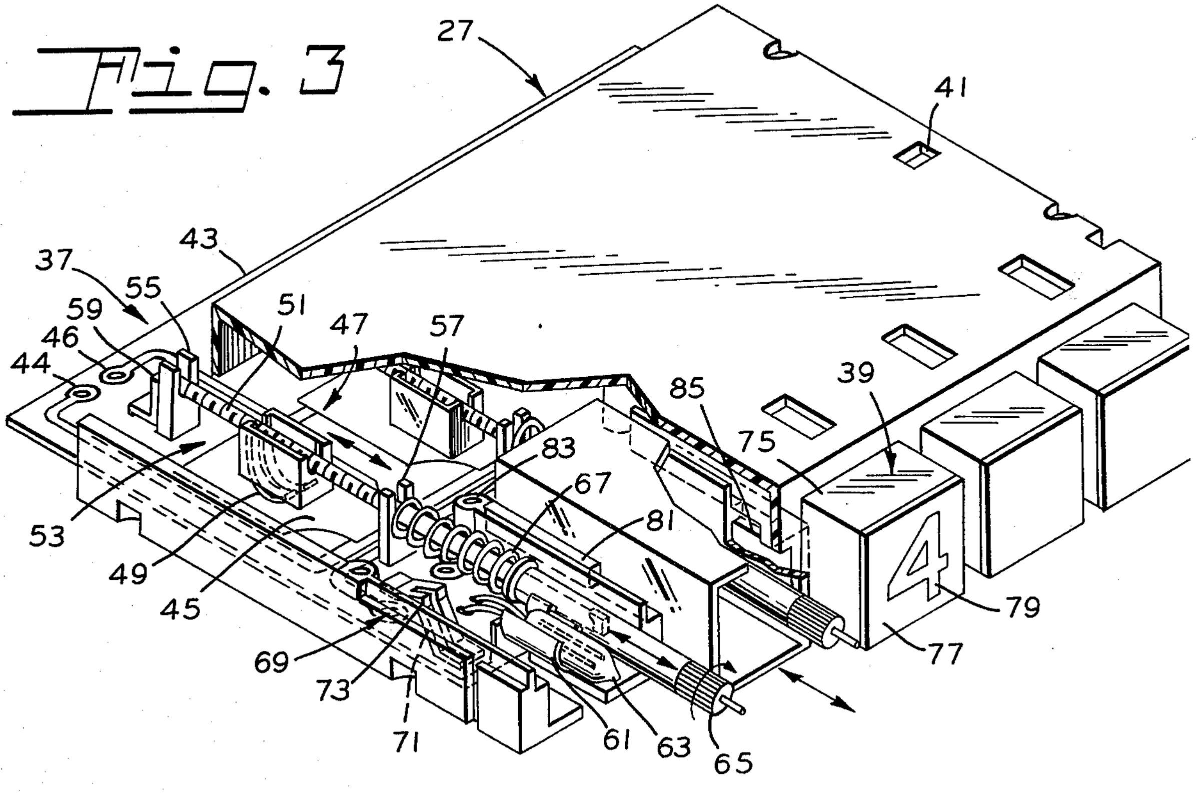
FIG. 3 is an isometric view partially in section of one row of the tuner module of FIG. 2.

Referring next to FIG. 2, therein is illustrated a plurality of push button tuner modules 27 arrayed in a stack to provide a unit suitable for use in a signal receiver. Each of the modules 27 includes an upper portion 33 and a lower portion 35 formed for jointure therebetween to provide an enclosure 37. The enclosure 37 forms a plurality of aligned openings with a push button 39 disposed within each of the openings at a slidable engagement with the enclosure 37. Moreover, the enclosure 37 includes a plurality of apertures 41 on one surface and protuberances (not shown) on the other surface and is formed for interlocking therebetween to provide a multiple module unit suitable for use in a television receiver. As best shown in FIG. 3, the push button tuner module 27 includes a printed circuit board 43 disposed within and extending outwardly from the enclosure 27. The circuit board 43 extends outward in a direction opposite from the push button 39 and the opening formed by the enclosure 37. The printed circuit board 43 has a fixed resistor 45 printed thereon with opposite ends connected to a pair of electrical conductors 44 and 46 intermediate a potential source and a potential reference level (not shown). A slider 47 has a contact arm 49 electrically and mechanically contacting the resistor 45 of the circuit board 43 and also contacting a threaded metal screw member 51 to provide an adjustable impedance 53. The threaded metal screw member 51 is supported by a pair of upstanding post members 55 and 57 affixed to the inner surface of the enclosure 37. A connector 59 electrically and mechanically contact one end of the metal screw member 51 and is affixed to the circuit board 43.

Also, an electrical insulator support member 61 is affixed to the circuit board 43 and a light source 63 in the form of a lamp bulb, for example, as supported thereby. A hollow cylindrical and adjustable insulator 65 is rotatably supported by the insulator support member 61 and telescoped over the end of and engagement with the screw member 51 opposite the end associated with the connector 59. Moreover, a spring member 57 is also telescoped over the screw member 51 and longitudinally confined intermediate one of the upstanding post members 57 and the hollow cylindrical adjustable insulator 65. A pair of switch members 49 (only one shown) are affixed to the printed circuit board 43 on opposite sides of the insulator support 61, light source 63, and hollow cylindrical adjustable insulator 65. Also, each one of the switch members 69 includes a spring like portion 71 to form an apex 73. Moreover, the switch members 69 serve to provide electrical connection of a power source (not shown) to a light source 63 and a potential from the connector 59 to the adjustable impedance 53 to a potential responsive tuner (not shown) of a signal receiver. Obviously, a multiple contact switch could be employed for the pair of switch members 69.

Additionally, each one of the push buttons 39 includes a body portion 75 and a removable end cap portion 77 having channel identifying indices 79 thereon. The body portion 75 of each one of the push button 39 includes an outward extending plug 81 formed for contact with a fastening means 83 of the enclosure 37 to limit inward movement of the push button 39 and for contact with an offset 85 of the enclosure 37 whereby outward movement of the push button 39 is limited.

As is illustrated in FIG. 3, to tune the individual channel of this type of a tuner module, the hollow cylindrical insulator 65 is pushed in and turned in one direction or the other to move the electrical contact arm 49 across the resistive element 45, thereby varying the electrical output from the module by the contacts 44 and 46. By appropriately setting each of the electrical contact arms 49 for the individual tuner channels, varying voltages may be applied to the local oscillator, for example, shown in FIG. 1 to thereby vary the frequency output of the local oscillator to be provided to the mixer 15.

While the above-described tuner cluster is one in which the voltage output therefrom is varied as the hollow cylindrical insulator 65 is turned, it is to be recognized that this is shown only by way of example and not of limitation, since it is readily apparent to those skilled in the art that the tuning cluster may utilize a variable inductor, a variable capacitor or the like in a similar fashion to vary the frequency output from the local oscillator in the process of selecting an individual channel for reception.

Figures 4, 5:
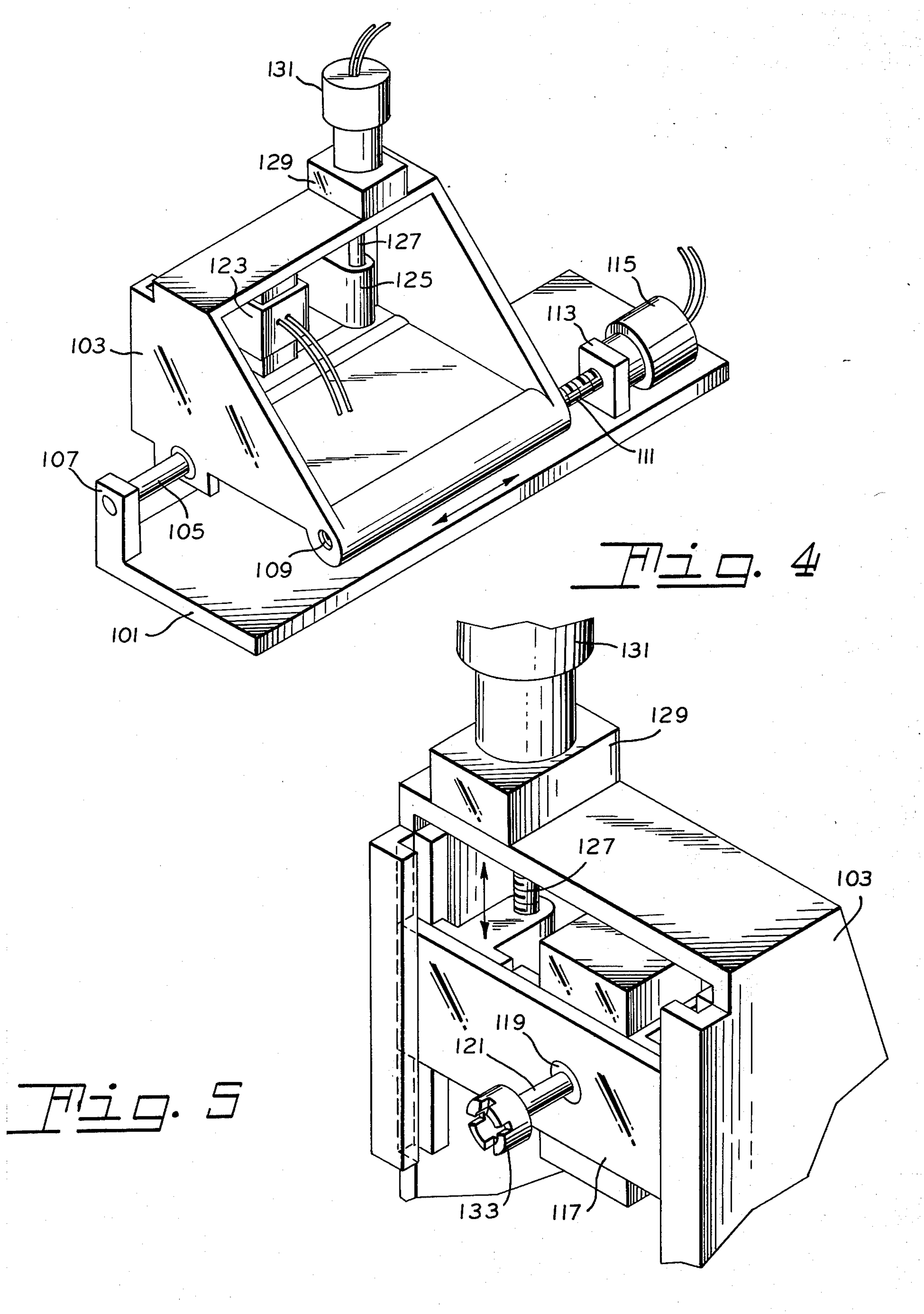
FIG. 4 is a rear isometric view of a two-dimensionally positionable drive motor adapted for use in conjunction with the present invention.
FIG. 5 is a partial front isometric view of the two-dimensionally driven drive motor of FIG. 4.

Referring next to FIGS. 4 and 5, the two-dimensionally positionable drive motor unit adapted for use in conjunction with the present invention includes a base member 101 upon which is supported a housing 103 supported at one end thereof by a bar 105 which extends between a pair of blocks 107 (only one shown) affixed to the base 101. At the rear of the housing 103 is a channel 109 into which is inserted a screw member 111 passing through and supported by a support 113. The other end of the screw member 111 is attached to a servo motor 115 which is attached to a suitable control point. Adapted to slide along the front of the housing 103 is a plate 117 having an opening 119 therein through which passes a drive arm 121 of a drive motor 123. A channeled member 125 has a threaded opening therein through which is inserted a second screw member 127 which passes through the top of the housing 103, through a support member 129 and is affixed to one end of a second servo motor 131. Attached to the end of the arm 121 on the motor 123 is a collet member 133 which is adapted to be engaged, for example, with the hollow cylindrical insulator members 65 illustrated in FIG. 3.

The device illustrated in FIGS. 4 and 5 is basically a two-dimensionally positionable apparatus adapted for use in conjunction with the present invention permitting the selective positioning and engagement of the driving arm 121 via the collet 133 with selected ones of the hollow cylindrical insulator members 65 of the tune module 27. The drive motor 115, via the support 113 and the threaded screw 111, varies the position of the drive motor and attached arm in the horizontal direction, and as can be readily seen, the servo motor 131, via the support 129 and the threaded screw 127, varies the position of the drive motor and arm in the vertical direction. By using appropriate signal inputs to the servo motors 115 and 131, respectively, the position of the mechanism can be selectively chosen to coincide with any one of the hollow cylindrical adjustment members 65 of the module 27, when it is appropriately situated in front of the drive mechanism of FIG. 4 and 5. The drive motor 123, driving arm 121 and collet 133 are adapted to be moved in a forward direction to come into positive engagement with the selected one of the tuning cylinders 65 upon activation, for example, of a selected relay (not shown) and any one of a number of means which are readily known to those of ordinary skill in the art.

In utilizing the adjustment mechanism of FIGS. 4 and 5 with the tuner cluster 27, the removable end cap portions 77 are first removed from all of the various push button channel members and the module 27 is placed with the push button modules parallel to and facing the plate 117 of the adjustment device of FIGS. 4 and 5. A suitable support member (not shown) is utilized to assure that each of the modules and its respective adjustment member 65 are at a predetermined reference position with respect to the driving arm 121 and collet 133 attached to the drive motor 123.

Figure 6:
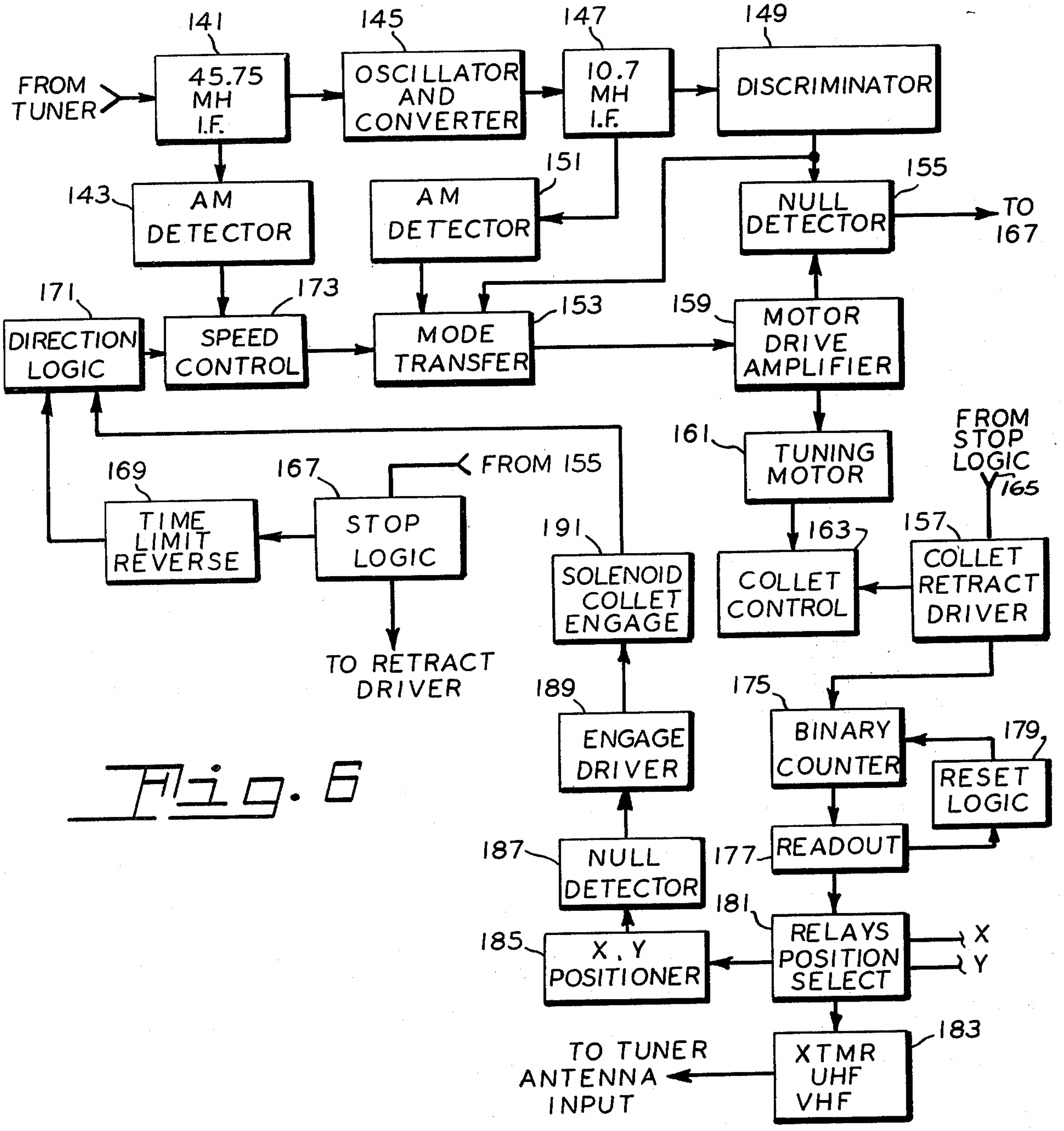
FIG. 6 is a block diagram of the electronic alignment apparatus and circuits for automatically presetting the individual channels of a multi-channeled tuning mechanism according to the present invention.

Referring next to FIG. 6, there is shown in block diagram form the electronic circuitry and apparatus operative in conjunction with the apparatus of FIGS. 4 and 5 to accomplish presetting of the plurality of channels of the tuner cluster 17 and the tuner 10. The circuitry includes a first IF amplifier 141 receiving an input from the tuner 10 and having an output going to a first AM detector 143 and a second output going to an oscillator converter circuit 145. The output from the oscillator converter circuit 145 is applied to a second IF 147 having a first output therefrom going to a discriminator 149 and a second AM detector 151. A mode transfer circuit 153 receives inputs from the discriminator 149 and from the second AM detector 151. The output of the discriminator 149 is also applied to a null detector 155 the output of which is applied to the stop logic circuitry 167. The output from the mode transfer circuit 153 is applied to a motor drive amplifier 159, which also provides an output to the null detector 155 and provides an additional output to a tuning motor 161. Outputs from the collet retract driver 157 and the tuning motor 161 are applied in parallel to the collet control 163. The collet retract driver also receives an input 165 from stop logic circuitry 167. A second output from the stop logic circuitry is applied to suitable time limit reverse circuitry 169 the output of which is provided to direction logic control circuitry 171. The output from the direction logic control circuitry is applied to a speed control circuit 173 which also receives an input from the first AM detector 143. The output of the speed control circuitry is applied to the mode transfer circuitry 153.

The output from the collet retract driver circuitry 157 is applied to a binary counter circuit 175 the output of which is applied to a read-out circuit 177. The read-out circuit 177 provides a first output to a reset logic circuit 179 and a second output to relays position select circuitry 181. The output from the reset logic circuit 179 is applied back to the binary counter circuit 175.

The first outputs from the relay position select circuitry are applied respectively to the servo position motors 115 and 131 respectively of FIG. 4, hereat referred to as the *xy* position controls. Another output from the relay position select circuitry is applied to a transmitter 183 which is adapted to provide both UHF and VHF signals upon selection, such signals corresponding to discrete television channels. The output from the transmitter 183 is applied to the antenna input terminals of the tuner 10.

Yet another output from the relays position select circuitry 181 is applied to the input of an *xy* positioner circuit 185 the output from which is connected to a null detector 187. The output of the null detector is applied to engage driver circuitry 189 the output of which is attached to the input of the solenoid collet engage circuitry 191, the output of which is applied to the input of the direction logic circuitry 171.

In operation, the output from the transmitters 183 is continuous wave (CW), and is crystal controlled to provide the discrete frequencies corresponding to the television channels to which the tuner is to be preset. The first IF amplifer 141 receiving the input from the tuner 10 is broadly tuned, for example, to 45.75 ± 3 megahertz. As soon as an output is detected from the IF amplifier 141 by the AM detector 143, indicating that the tuning is beginning to come within range, the AM detector 143 provides a signal to the speed control circuitry 173 which operates in conjunction and through the source solenoid 153 to slow down the motor drive amplifier 159 enabling a slower transition through the anticipated null point. When an output from the second IF amplifier 147 is detected by the AM detector 151, the AM detector effectively takes control of the motor away from the first AM detector 143 and transfers it to the discriminator circuitry 149 and the null detector circuitry 155. As a practical matter the first AM detector 143 does not control the drive motor 123 of FIG. 4 directly, but rather establishes a DC level which gives a fixed slow speed control for the motor. The discriminator circuitry 149 is intended to be a standard discriminator control system wherein when the derived signal is on frequency a zero output is provided therefrom. If the applied frequency is above the null point, then a positive output is derived and if it is below the null point, then the negative output is derived from the discriminator (or the opposite can be true depending on how the discriminator is set up). The first output from the discriminator 149 which is applied to the mode transfer circuit 153 generates a DC voltage which is applied to the motor drive amplifier 159 and fed to the tuning control motor 161. (This being the motor 123, for example, of FIG. 4). The output from the motor drive amplifier is also applied to the null detector so that the null detector has inputs from both the motor drive amplifier and the discriminator, this dual input being used to take care of the situation where you have a zero crossing either from the discriminator or from the motor, for example, and the other may be reversing and going through a zero point. Thus in order for an output to be derived from the null detector to be applied to the collet retract driver circuitry 157, it must detect a zero level from the discriminator as well as the motor drive amplifier to indicate the proper frequency selection has been obtained. When that condition occurs the collet retract driver is activated to mechanically unlatch the collet 133 from engagement with the cylindrical member 65 of the appropriately tuned channel in the tuning cluster 27. At this point the tuning motor 161 will also have stopped and the collet retract driver circuitry 157 will apply a signal to the binary counter 175. This signal indicates that the channel has been completely tuned and initiates the indexing of the system to the next channel to be tuned. In doing this the binary counter provides an output to the readout device 177 which activates the relays position select circuitry 181 which is operative via the servo motors 115 and 131 to advance the drive arm and collet attached thereto to be in position for engagement with the next channel to be tuned. This also provides a signal to the X,Y positioner 185, the output of which is fed to the null detector 187. When the proper null is obtained, the engage circuitry 189, 191 receives an appropriate pulse to initiate engagement of the collet with the tuning mechanism of the next channel to be tuned.

An output from the relays position select circuitry 181 also controls the frequency to be derived from the transmitter 183 to be applied to the tuner antenna input. At this point in time if everything has functioned properly the tuning cycle is repeated for the next channel to be tuned.

After all of the channels of the tuner cluster 17 have been properly aligned and preset, the readout counter 177 will indicate that the last channel has been serviced and the next count or pulse via the counter 170 is applied by the readout to the reset logic 179. There may also be provided a lockout logic circuitry to prevent the mechanism from reengaging the first channel (not shown), or in the alternative circuitry may be provided to shut down the system once the last channel has been tuned.

With respect to the time limit reverse circuitry and the stop logic 169 and 167 respectively, if for any reason there is a defective channel in the tuner cluster 17 or a null is not detected after a certain period of time, the time limit reverse circuitry 169 provides an output to activate the direction logic control circuitry 171, which will reverse the motor drive 123, causing it to tune back down through the band until a proper null is detected. If no null is detected at the end of the time limit, the stop logic 167 is activated causing the system to stop at that tuner position with the stop logic additionally causing the retract driver to be activated thereby removing the collet 133 from engagement with that channel control member.

While the foregoing describes the basic functioning of the invention, it will be recognized that there may be additional features added thereto or aforementioned individual functions can be changed depending on particular design requirements or personal preferances. For example, the system could also be provided with a device which will cause the tuning function to continue even if the system has been stopped at a defective channel, the system inherently being made capable of providing an indication that a particular channel in the cluster was defective. Alternatively the system can be provided with a restart button which provides an operator with the capability of restarting the system in its tuning operation once a defective channel has been noted. Also, it is obvious that the system is not limited to tuning clusters where the tuning controls are arranged in a square or rectangular format.

While there has been shown and described what are at present considered the preferred embodiments of the invention, it will be obvious to those skilled in the art that various changes and modifications may be made therein without departing from the scope of the invention as defined by the appended claims.

We claim:

1. Apparatus for automatically selecting signals and adjusting controls of a plurality of signal channels to effect pre-set tuning of the signal channels of a tuner in a television receiver comprising:

signal source means coupled to said tuner for sequentially providing signals at different frequencies for pre-set tuning a plurality of signal channels said different frequencies corresponding to the tuned frequencies of said signal channels;

motor driven tuner arm means formed for engagement with and adjustment of said controls of said plurality of signal channels;

detector means coupled to the output of said tuner and to said motor driven tuner arm means to effect activation of said motor driven tuner arm means in response to a signal from said tuner and cause pre-set tuning of a first signal channel; and sequential stepping means coupled to said detector and motor driven tuner arm means and to said signal source means, said sequential stepping means automatically moving said motor driven tuner arm means to said adjustable control of a second signal channel and selecting a second signal from said signal source means for tuning of said second signal channel in response to a signal from said detector and motor driven tuner arm means indicating pre-set tuning of said first signal channel.

2. The automatic pre-set tuning apparatus of Claim 1 wherein said detector means includes a time limit reverse means for reversing the rotational direction of said motor driven tuner arm means and tuning control of a given signal channel when a signal representative of channel tuning is not detected by said detector means.

3. The automatic pre-set apparatus of claim 1 wherein said detector means includes a first frequency responsive means coupled to said tuner and to said motor upon attainment of a detected signal within a given frequency range and a second frequency responsive means for transferring control of said motor driven tuner arm means from said first frequency responsive means to a discriminator means which detects a desired pre-set tuning of a signal channel and discontinues rotation of said motor driven tuner arm means.

4. A method for automatically pre-setting a tuning control in the signal channels of a tuner for a television receiver comprising the steps of:

a. engaging a motor driven tuner arm and a tuning control of a first signal channel having a first pre-determined tuned frequency;

b. applying a signal at said first pre-determined tuned frequency to said tuner;

c. activating said motor driven tuner arm to vary said tuning control and vary the output signal from said tuner;

d. detecting said output signal from said tuner, said output signal having a pre-determined magnitude representative of a tuned signal channel;

e. inactivating said motor driven tuner arm means in response to a signal having said pre-determined magnitude;

f. automatically shifting said motor driven tuner arm means into position for engagement with a tuning control of a second signal channel;

g. repeating steps (a) through (f) for each one of said plurality of signal channels of said tuner.

* * * * *